United States Patent
Ku

(10) Patent No.: US 9,524,760 B2
(45) Date of Patent: Dec. 20, 2016

(54) DATA OUTPUT CIRCUIT

(71) Applicant: SK hynix Inc., Icheon-si, Gyeonggi-do (KR)

(72) Inventor: Kie Bong Ku, Icheon-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/639,670

(22) Filed: Mar. 5, 2015

(65) Prior Publication Data
US 2016/0163361 A1 Jun. 9, 2016

(30) Foreign Application Priority Data

Dec. 8, 2014 (KR) .................. 10-2014-0170544

(51) Int. Cl.
*H03K 3/356* (2006.01)
*G11C 7/10* (2006.01)

(52) U.S. Cl.
CPC .................. *G11C 7/1051* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,977,528 B2 * | 12/2005 | Kang | ............... | H03K 3/012 326/121 |
| 7,782,108 B2 * | 8/2010 | Sedlak | ............ | H03K 3/356173 327/208 |
| 8,970,274 B2 * | 3/2015 | Geisler | ........... | H03K 3/356113 327/239 |

FOREIGN PATENT DOCUMENTS

KR   1020030047035 A   6/2003

* cited by examiner

*Primary Examiner* — An Luu
(74) *Attorney, Agent, or Firm* — William Park & Associates Ltd.

(57) ABSTRACT

A data output circuit includes a first trigger unit and a signal generation unit. The first trigger unit is inputted with first data in a first mode and a second mode, and outputs the first data in response to a first trigger signal. The signal generation unit, in the first mode, outputs the first trigger signal in response to a first clock signal, and, in the second mode, retains the first trigger signal in a first state regardless of the first clock signal.

20 Claims, 7 Drawing Sheets

DATA OUTPUT CIRCUIT

CROSS-REFERENCES TO RELATED APPLICATION

The present application claims priority under 35 U.S.C. §119(a) to Korean application number 10-2014-0175044 filed on Dec. 8, 2014, in the Korean Intellectual Property Office, which is incorporated herein by reference in its entirety.

BACKGROUND

1. Technical Field

Embodiments of the present invention generally relate to an integrated circuit, and more particularly, to a data output circuit.

2. Related Art

Semiconductor apparatuses, specifically, semiconductor memory apparatuses may be used to store data. Memory apparatuses may be generally divided into a nonvolatile type and a volatile type.

A nonvolatile memory apparatus may retain stored data even with the absence of a power supply. The nonvolatile memory apparatus may include a flash memory apparatus such as a NAND flash and a NOR flash, a ferroelectric random access memory ("FeRAM"), a phase change random access memory ("PCRAM"), a magnetic random access memory ("MRAM") or a resistive random access memory ("ReRAM").

In contrast, a volatile memory apparatus requires a power supply to retain data. The volatile memory apparatus may include a static random access memory ("SRAM") or a dynamic random access memory ("DRAM"). The volatile memory apparatus, which has a relatively high processing speed, may be used as a buffer memory apparatus, a cache memory apparatus of a CPU, or a primary memory of a computer system.

SUMMARY

Various embodiments are directed to a data output circuit which outputs inputted data in response to trigger signals.

In an embodiment of the present invention, a data output circuit may include: a first trigger unit configured to be inputted with first data in a first mode and a second mode, and output the first data in response to a first trigger signal; and a signal generation unit configured to, in the first mode, output the first trigger signal in response to a first clock signal, and, in the second mode, retain the first trigger signal in a first state regardless of the first clock signal.

In an embodiment of the present invention, a data output section configured to output inputted data in response to a trigger signal and a control signal in a first mode and a second mode; and a mode detecting section configured to detect a mode signal indicating that the data output circuit is in the second mode and retain the control signal in a first state.

In an embodiment of the present invention, a data output circuit may include: a first trigger unit configured to output first data in response to a first trigger signal which is enabled; a second trigger unit configured to output second data in response to a second trigger signal which is enabled; and a signal generation unit configured to, in a first mode, output the first and second trigger signals, which have pulse shapes, and, in the second mode, retain the first trigger signal in an enabled state and retain the second trigger signal in a disabled state.

DETAILED DESCRIPTION

Figure 1:
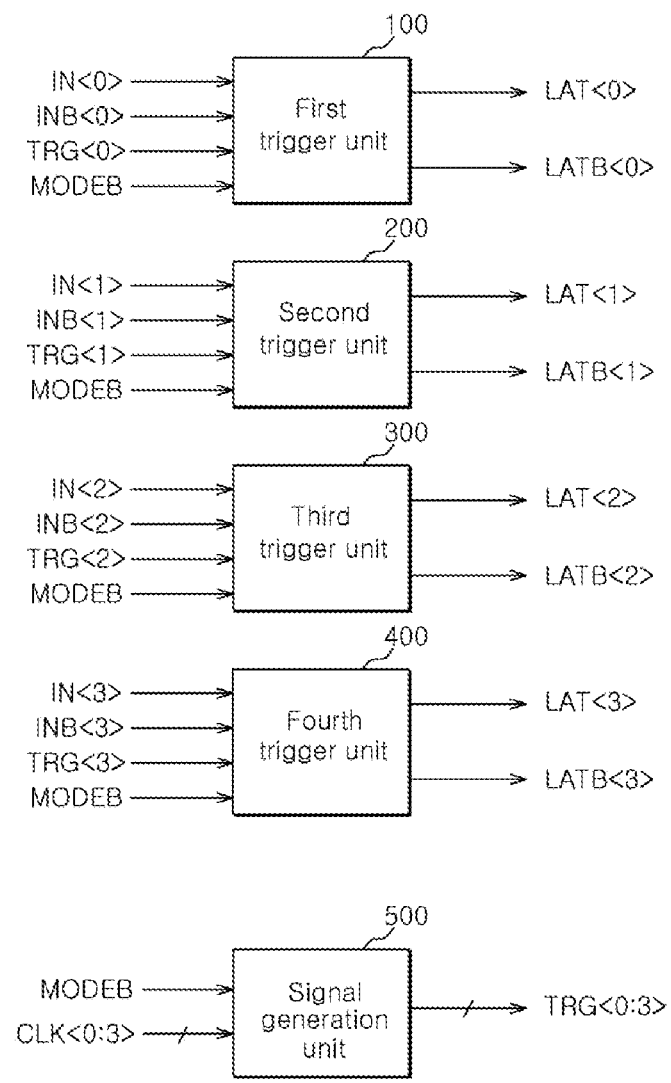
FIG. 1 is a block diagram schematically illustrating an example of a data output circuit in accordance with an embodiment of the present invention.

FIG. 1 is a block diagram schematically illustrating an example of a data output circuit in accordance with an embodiment of the present invention.

Referring to FIG. 1, a data output circuit 10 in accordance with an embodiment of the present invention may include first to fourth trigger units 100 to 400, and a signal generation unit 500.

In an embodiment of the present invention, the data output circuit 10 may operate not only when the data output circuit 10 is in a first mode in which the data output circuit 10 output ordinary data signals which are inputted thereto, but also when the data output circuit 10 is in a second mode in which the data output circuit 10 output data signals for a particular purpose.

Each of the first to fourth trigger units 100 to 400 may be inputted with data and output the inputted data as output data in response to a trigger signal. For example, the first trigger unit 100 may be inputted with first data IN<0> and INB<0>, and output the first data IN<0> and INB<0> as first output data LAT<0> and LATB<0> in response to a first trigger signal TRG<0>. Data signals being inputted to the first to fourth trigger units 100 to 400 may have different phases. The first to fourth trigger units 100 to 400 may shift the voltage levels of the data signals, and then output the output data. Each of the first to fourth trigger units 100 to 400 may be inputted with a mode signal MODEB to detect whether the mode signal MODEB corresponds to the first mode or the second mode and operate according to which mode the data output circuit 10 is in. For example, the mode signal MODEB may be used to determine whether it is in the first mode or the second mode.

The signal generation unit 500 may be inputted with the mode signal MODEB to detect the first mode and the second mode.

In the first mode, the signal generation unit 500 may output first to fourth trigger signals TRG<0:3> for controlling the first to fourth trigger units 100 to 400 in response to first to fourth clock signals CLK<0:3>. The first to fourth trigger signals TRG<0:3> may have phase difference, and this may be due to the phase difference between the first to fourth clock signals CLK<0:3>. For example, the first to fourth clock signals CLK<0:3> may be out of phase with each other by ¼ cycle, and therefore the first to fourth trigger signals TRG<0:3> may be out of phase with each other by ¼ cycle.

In the first mode, the first to fourth trigger units 100 to 400 may respectively output first to fourth data IN<0:3> and INB<0:3> as first to fourth output data LAT<0:3> and LATB<0:3> in response to the first to fourth trigger signals TRG<0:3> which are generated by the signal generation unit 500 according to the first to fourth clock signals CLK<0:3>.

The second mode may include a mode in which the signal outputted from a data pad of a semiconductor apparatus is monitored by an external device. The second mode may include a write leveling mode, a connectivity test ("CT") mode, and a read preamble training mode. Even in the second mode, at least one of the first to fourth trigger units 100 to 400 may be used to output inputted data as the output data.

According to an embodiment of the present invention, in the second mode, the signal generation unit 500 may retain at least one of the first to fourth trigger signals TRG<0:3> in an enabled state. For example, in the second mode, the signal generation unit 500 may retain at least one of the trigger signals TRG<0:3> in an enabled state even though the first to fourth clock signals CLK<0:3> are not inputted. For another example, in the second mode, the signal generation unit 500 may retain at least one of the trigger signals TRG<0:3> in an enabled state regardless of the first to fourth clock signals CLK<0:3>. In the second mode, the signal generation unit 500 may retain at least one of the first to fourth trigger signals TRG<0:3> in a first state (e.g., an enabled state), and retain remaining trigger signals in a second state (e.g., a disabled state). For example, in the second mode, the signal generation unit 500 may retain the first trigger signal TRG<0> in an enabled state, and retain the second to fourth trigger signals TRG<1:3> in a disabled state.

In the case where, in the second mode, the signal generation unit 500 retains the first trigger signal TRG<0> in an enabled state, and retains the second to fourth trigger signals TRG<1:3> in a disabled state, the first trigger unit 100 may output the inputted first data IN<0> and INB<0> as the first output data LAT<0> and LATB<0> in response to the enabled first trigger signal TRG<0>, and the second to fourth trigger units 200 to 400 may not output the inputted data IN<1:3> and INB<1:3> as the output data LAT<1:3> and LATB<1:3> in response to the disabled second to fourth trigger signals TRG<1:3>. In the second mode, the external device may normally perform a predetermined operation by monitoring the first output data LAT<0> and LATB<0> outputted through the first trigger unit 100.

While FIG. 1 shows that the data output circuit 10 includes 4 trigger units, it is to be noted that the number of trigger units is not specifically limited.

Figure 2:
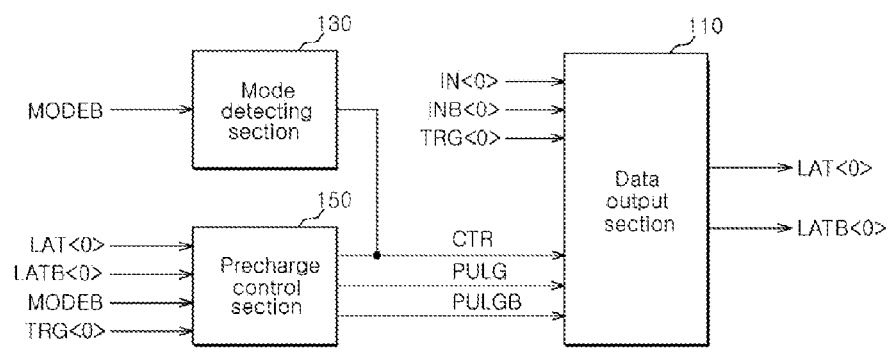
FIG. 2 is a block diagram schematically illustrating an example of the first trigger unit shown in FIG. 1.

FIG. 2 is a block diagram schematically illustrating an example of the first trigger unit 100 shown in FIG. 1. Since the first to fourth trigger units 100 to 400 of FIG. 1 may be configured and operate in substantially the same way, the first trigger unit 100 will be described as an example.

The first trigger unit 100 may include a data output section 110, a mode detecting section 130, and a precharge control section 150.

The data output section 110 may output the inputted first data IN<0> and INB<0> as the first output data LAT<0> and LATB<0> in response to the enabled first trigger signal TRG<0> and an enabled control signal CTR. The data output section 110 may shift the voltage levels of the first data IN<0> and INB<0>, and output the first output data LAT<0> and LATB<0>. The data output section 110 may be inputted with first and second pulse signals PULG and PULGB for controlling voltage supply.

The mode detecting section 130 may be inputted with the mode signal MODEB, and output the control signal CTR. The mode detecting section 130 may detect a mode signal MODEB indicating that the data output circuit is in the second mode, and retain the control signal CTR in an enabled state.

The precharge control section 150 may be inputted with the first output data LAT<0> and LATB<0> which are fed back from an output node of data output section 110, the mode signal MODEB and the first trigger signal TRG<0>, and output the control signal CTR and the first and second pulse signals PULG and PULGB. The precharge control section 150 may provide the control signal CTR to perform a precharge operation of the data output section 110 according to whether the first output data LAT<0> and LATB<0> are outputted from the data output section 110 in the first mode.

Figure 3:
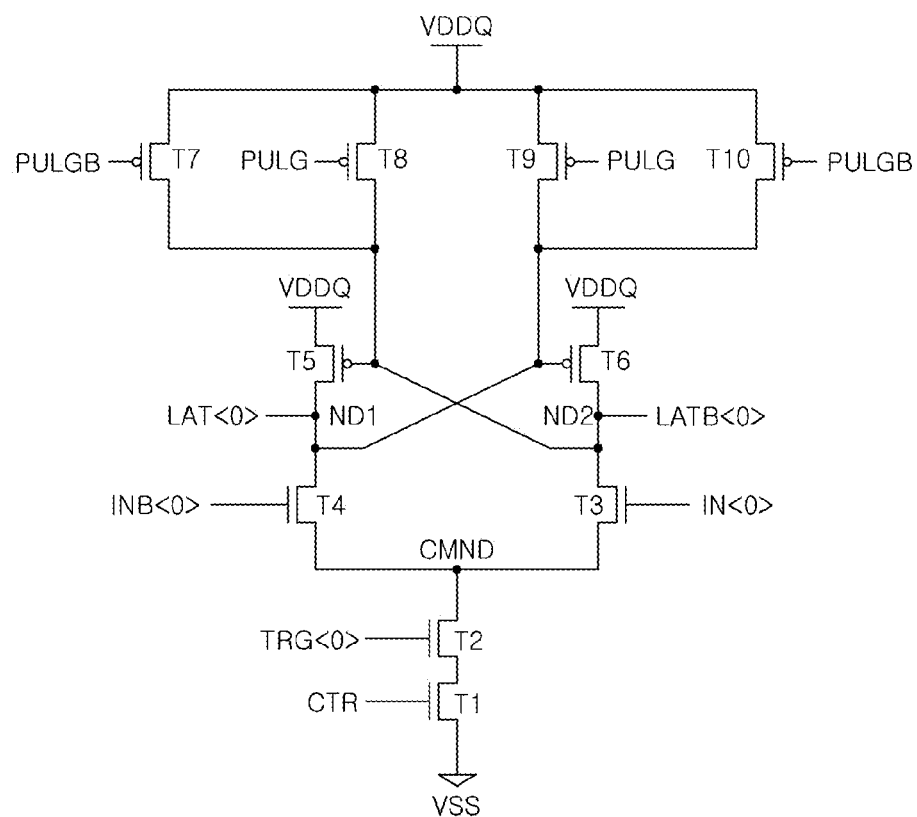
FIG. 3 is a circuit diagram illustrating in detail an example of the data output section shown in FIG. 2.

FIG. 3 is a circuit diagram illustrating in detail an example of the data output section 110 shown in FIG. 2.

The data output section 110 may be inputted with the first data IN<0> and INB<0>, and output the first output data LAT<0> and LATB<0> from first and second output nodes ND1 and ND2 in response to the first trigger signal TRG<0> and the control signal CTR which are enabled to logic high levels. The data output section 110 may shift the voltage levels of the first data IN<0> and INB<0> by using an output voltage VDDQ, and output the first output data LAT<0> and LATB<0>.

The data output section 110 may not output the first data IN<0> and INB<0> as the first output data LAT<0> and LATB<0> when at least one of the first trigger signal TRG<0> and the control signal CTR is disabled to a low level. The first and second output nodes ND1 and ND2 may be precharged by being supplied with the output voltage VDDQ, when at least one of the first trigger signal TRG<0> and the control signal CTR is disabled and at least one of the first and second pulse signals PULG and PULGB is enabled to a logic low level.

The data output section 110 may include first to tenth transistors T1 to T10.

The first transistor T1 may be inputted with the control signal CTR through the gate thereof, and be electrically coupled between the node of a ground voltage VSS and the second transistor T2. The second transistor T2 may be inputted with the first trigger signal TRG<0> through the gate thereof, and be electrically coupled between the first transistor T1 and a common node CMND. The third transistor T3 may be inputted with the first data IN<0> through the gate thereof, and be electrically coupled between the common node CMND and the second output node ND2. The fourth transistor T4 may be inputted with the first data INB<0> through the gate thereof, and be electrically coupled between the common node CMND and the first output node ND1. The fifth transistor T5 may have the gate to which the second output node ND2 is electrically coupled, and be electrically coupled between a node for supplying the output voltage VDDQ and the first output node ND1. The sixth transistor T6 may have the gate to which the first output node ND1 is electrically coupled, and be electrically coupled between the node of the output voltage VDDQ and the second output node ND2. The seventh transistor T7 may be inputted with the second pulse signal PULGB through the gate thereof, and be electrically coupled between node of the output voltage VDDQ and the second output node ND2. The eighth transistor T8 may be inputted with the first pulse signal PULG through the gate thereof, and be electrically coupled between the node of the output voltage VDDQ and the second output node ND2. The ninth transistor T9 may be inputted with the first pulse signal PULG through the gate thereof, and be electrically coupled between the node of the output voltage VDDQ and the first output node ND1. The tenth transistor T10 may be inputted with the second pulse signal PULGB through the gate thereof, and be electrically coupled between the node of the output voltage VDDQ and the first output node ND1.

Figure 4:
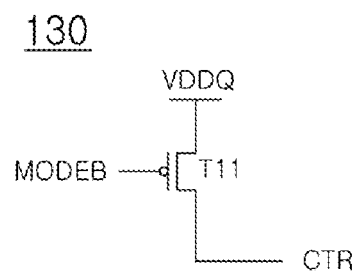
FIG. 4 is a circuit diagram illustrating in detail an example of the mode detecting section shown in FIG. 2.

FIG. 4 is a circuit diagram illustrating in detail an example of the mode detecting section 130 shown in FIG. 2.

The mode detecting section 130 may detect that the mode signal MODEB indicates the second mode, and retain the control signal CTR in the enabled state. For example, the mode signal MODEB may be applied at a logic high level in the first mode, and be applied at a logic low level in the second mode.

The mode detecting section 130 may include an eleventh transistor T11. The eleventh transistor T11 may be inputted with the mode signal MODEB through the gate thereof, be electrically coupled to the node of the output voltage VDDQ through the source thereof, and output the control signal CTR through the drain thereof.

Figure 5:
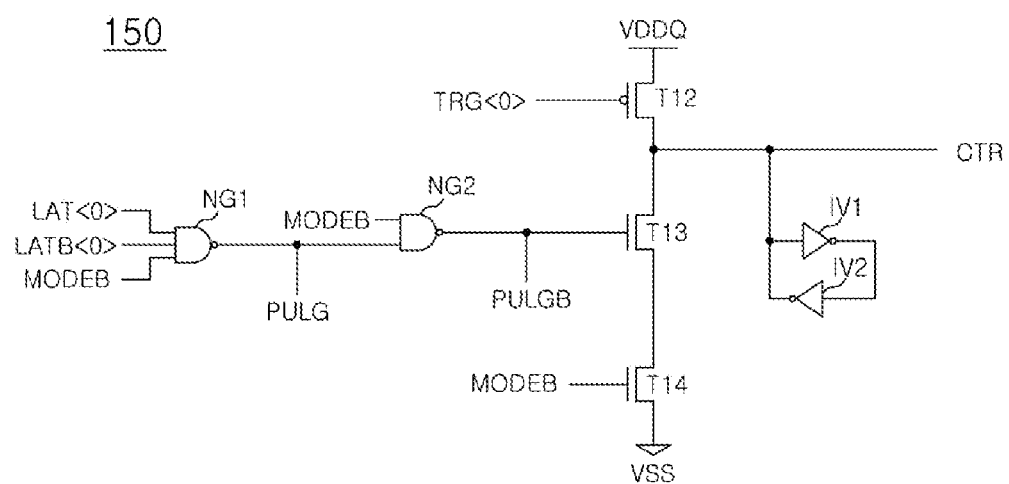
FIG. 5 is a circuit diagram illustrating in detail an example of the precharge control section shown in FIG. 2.

FIG. 5 is a circuit diagram illustrating in detail an example of the precharge control section 150 shown in FIG. 2.

Referring to FIG. 2, precharge control section 150 may control the precharge of the data output section 110 by providing the control signal CTR to the data output section 110. For example, the precharge control section 150 may control the precharge of the first and second output nodes ND1 and ND2 of the data output section 110, which is shown in FIG. 3, through the control signal CTR according to whether the first output data LAT<0> and LATB<0> are outputted from the data output section 110, in the first mode. The precharge control section 150 may disable the control signal CTR when the data output section 110 outputs the first output data LAT<0> and LATB<0>, in the first mode. The precharge control section 150 may enable the control signal CTR when the first trigger signal TRG<0> is disabled, in the first mode.

The precharge control section 150 may include first and second NAND gates NG1 and NG2, twelfth to fourteenth transistors T12 to T14, and first and second inverters IV1 and IV2.

The first NAND gate NG1 may be inputted with the first output data LAT<0> and LATB<0> and the mode signal MODEB, and output the first pulse signal PULG. The second NAND gate NG2 may be inputted with the output of the first NAND gate NG1 and the mode signal MODEB, and output the second pulse signal PULGB. At least one of the first and second pulse signals PULG and PULGB may be outputted at the logic low level in the first mode.

The twelfth transistor T12 may be inputted with the first trigger signal TRG<0> through the gate thereof, and be electrically coupled between the node of the output voltage VDDQ and the thirteenth transistor T13. The thirteenth transistor T13 may be inputted with the output of the second NAND gate NG2 through the gate thereof, and be electrically coupled between the twelfth transistor T12 and the fourteenth transistor T14. The fourteenth transistor T14 may be inputted with the mode signal MODEB through the gate thereof, and be electrically coupled between the thirteenth transistor T13 and the node of the ground voltage VSS. The first inverter IV1 may invert the control signal CTR, and the second inverter IV2 may invert the output of the first inverter IV1, and output the control signal CTR.

Figure 6:
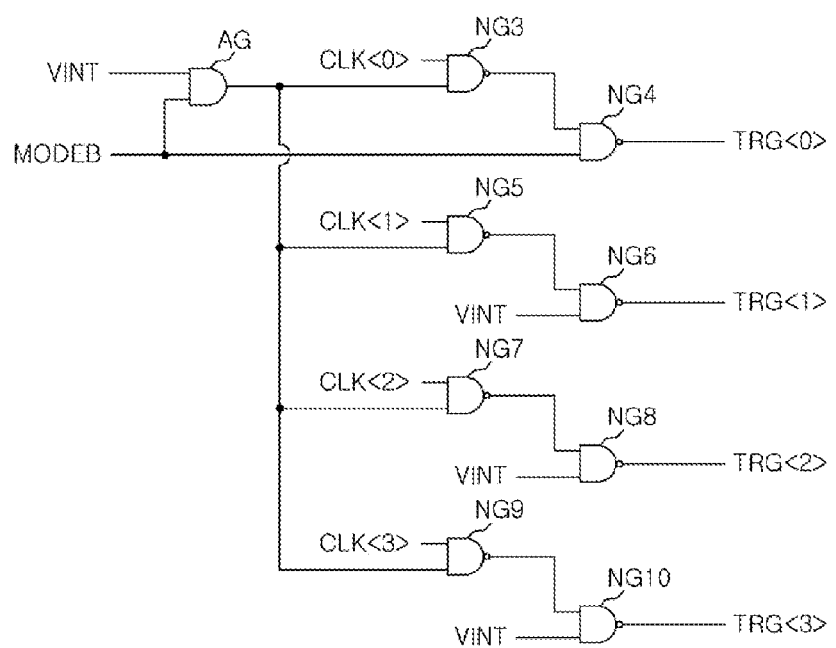
FIG. 6 is a circuit diagram illustrating in detail an example of the signal generation unit shown in FIG. 1.

FIG. 6 is a circuit diagram illustrating in detail an example of the signal generation unit 500 shown in FIG. 1.

The signal generation unit 500 may output the first to fourth trigger signals TRG<0:3> in response to the first to fourth clock signals CLK<0:3> in the first mode. The first to fourth clock signals CLK<0:3> may be out of phase with each other by ¼ cycle, and the signal generation unit 500 may output the first to fourth trigger signals TRG<0:3> which are out of phase with each other by ¼ cycle.

The signal generation unit 500 may retain the first trigger signal TRG<0> in the enabled state and retain the second to fourth trigger signals TRG<1:3> in the disabled state in the second mode.

The signal generation unit 500 may include an AND gate AG, and third to tenth NAND gates NG3 to NG10.

The AND gate AG may be inputted with the mode signal MODEB and an internal voltage VINT which is applied at a logic high level, and perform an AND operation on the mode signal MODEB and the internal voltage VINT. The third NAND gate NG3 may be inputted with the first clock signal CLK<0> and the output of the AND gate AG, and perform a NAND operation on the first clock signal CLK<0> and the output of the AND gate AG. The fourth NAND gate NG4 may be inputted with the output of the third NAND gate NG3 and the mode signal MODEB, and output the first trigger signal TRG<0>, which is generated by performing a NAND operation on the output of the third NAND gate NG3 and the mode signal MODEB. The fifth NAND gate NG5 may be inputted with the second clock signal CLK<1> and the output of the AND gate AG, and perform a NAND operation on the second clock signal CLK<1> and the output of the AND gate AG. The sixth NAND gate NG6 may be inputted with the output of the fifth NAND gate NG5 and the internal voltage VINT, and output the second trigger signal TRG<1>, which is generated by performing a NAND operation on the output of the fifth NAND gate NG5 and the internal voltage VINT. The seventh NAND gate NG7 may be inputted with the third clock signal CLK<2> and the output of the AND gate AG, and perform a NAND operation on the third clock signal CLK<2> and the output of the AND gate AG. The eighth NAND gate NG8 may be inputted with the output of the seventh NAND gate NG7 and the internal voltage VINT, and output the third trigger signal TRG<2>, which is generated by performing a NAND operation on the output of the seventh NAND gate NG7 and the internal voltage VINT. The ninth NAND gate NG9 may be inputted with the fourth clock signal CLK<3> and the output of the AND gate AG, and perform a NAND operation on the fourth clock signal CLK<3> and the output of the AND gate AG. The tenth NAND gate NG10 may be inputted with the output of the ninth NAND gate NG9 and the internal voltage VINT, and output the fourth trigger signal TRG<3>, which is generated by performing a NAND operation on the output of the ninth NAND gate NG9 and the internal voltage VINT.

Figure 7:
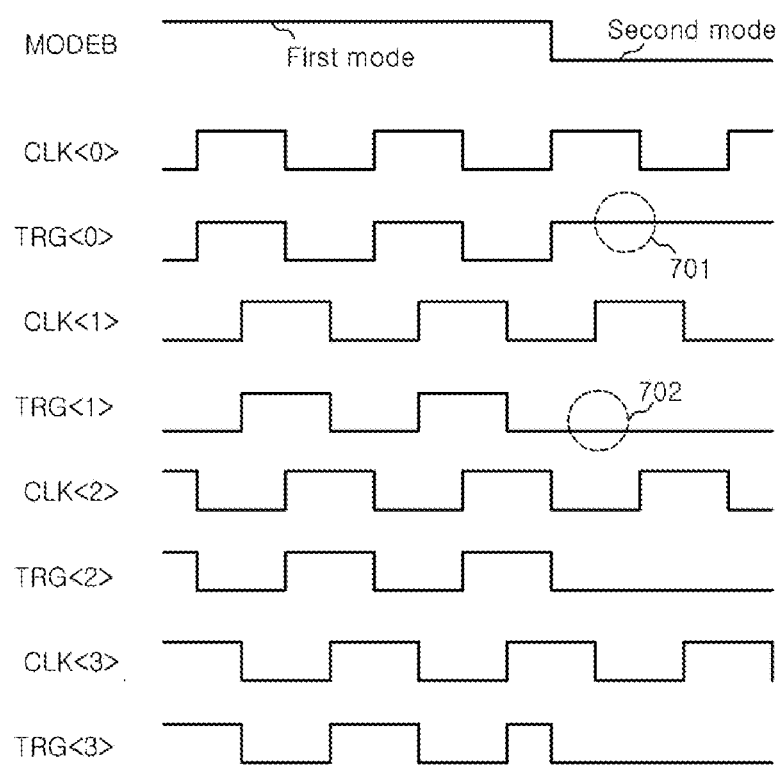
FIG. 7 is an example of a waveform diagram for explaining the operation of the signal generation unit shown in FIG. 6.
Figure 8:
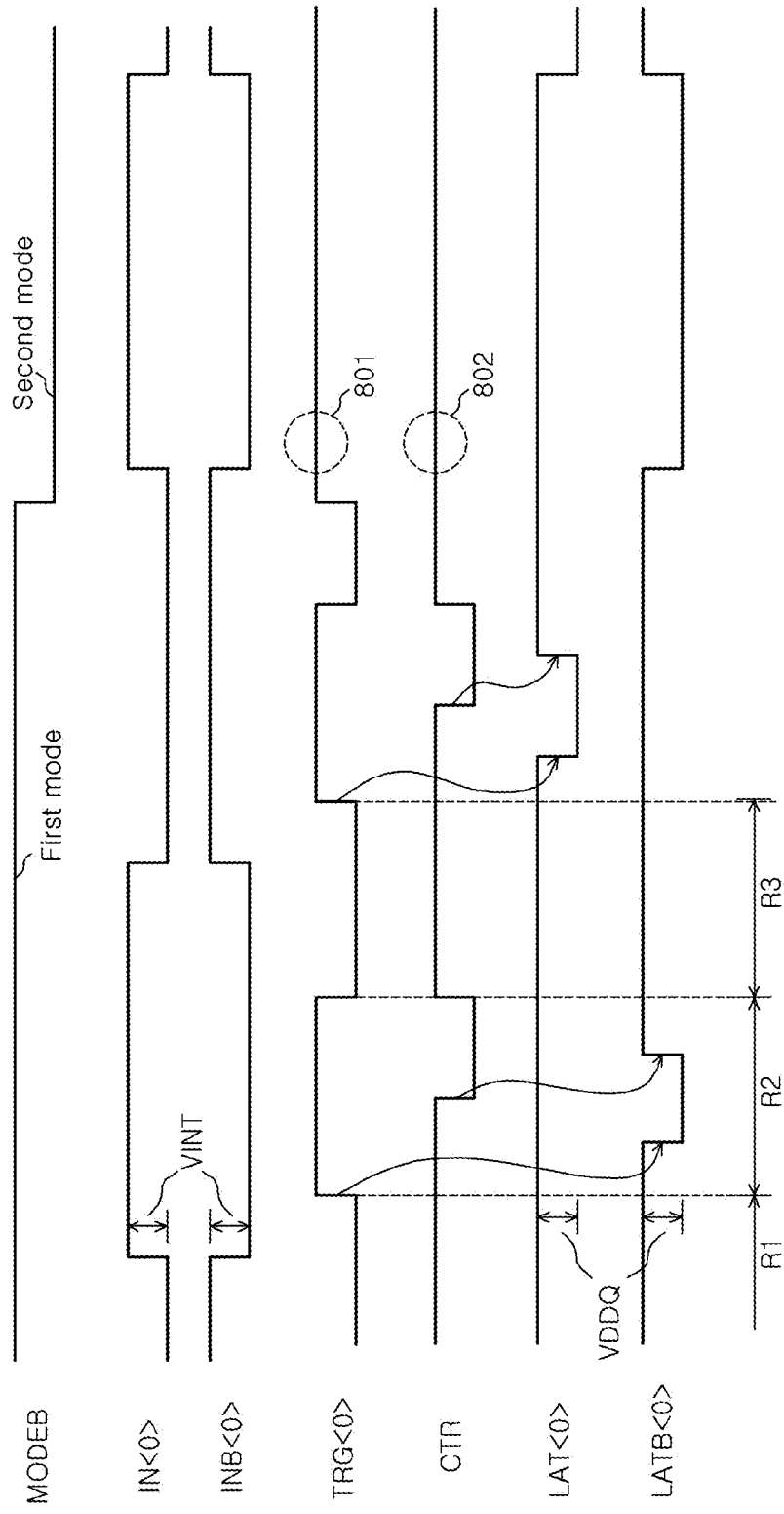
FIG. 8 is an example of a waveform diagram for explaining the operation of the first trigger unit shown in FIG. 1.

FIG. 7 is an example of a waveform diagram for explaining the operation of the signal generation unit 500 shown in FIG. 6. FIG. 8 is an example of a waveform diagram for explaining the operation of the first trigger unit 100 shown in FIG. 1. Hereafter, operations of the data output circuit 10 will be described in detail with reference to FIGS. 1 to 8.

The signal generation unit 500 may output the first to fourth clock signals CLK<0:3> as the first to fourth trigger signals TRG<0:3> in response to the mode signal MODEB which is applied at the logic high level in the first mode. The signal generation unit 500 may output the first to fourth trigger signals TRG<0:3> in response to the first to fourth clock signals CLK<0:3>, respectively. The first to fourth trigger signals TRG<0:3> may have pulse shapes.

The first to fourth trigger units 100 to 400 may shift the voltage levels of the first to fourth data IN<0:3> and INB<0:3> by the level of the output voltage VDDQ in response to the first to fourth trigger signals TRG<0:3>, and output the first to fourth output data LAT<0:3> and LATB<0:3>. For example, operations of the first trigger unit 100 according to the first trigger signal TRG<0>, which is disabled in a first period R1, enabled in a second period R2, and disabled in a third period R3 (see FIG. 8), are as follows.

In the first period R1, the second transistor T2 of the data output section 110 is turned off in response to the disabled first trigger signal TRG<0>, and accordingly, the output nodes ND1 and ND2 may be precharged with the output voltage VDDQ. The twelfth transistor T12 of the precharge control section 150 is turned on in response to the disabled first trigger signal TRG<0>, and accordingly, the control signal CTR may be enabled.

In the second period R2, the data output section 110 may output the first data IN<0> and INB<0> as the first output data LAT<0> and LATB<0> in response to the first trigger signal TRG<0> and the control signal CTR which are enabled. The data output section 110 may shift the voltage levels of the first data IN<0> and INB<0>, for example, from the level of the internal voltage VINT to the level of the output voltage VDDQ. Further, the twelfth transistor T12 of the precharge control section 150 may be turned off in response to the enabled first trigger signal TRG<0>, and the thirteenth transistor T13 may be turned off based on the first output data LAT<0> and LATB<0>. Accordingly, the control signal CTR may be disabled. The first transistor T1 of the data output section 110 may be turned off in response to the disabled control signal CTR, and accordingly, the output nodes ND1 and ND2 may be precharged again to the level of the output voltage VDDQ.

In the third period R3, the second transistor T2 of the data output section 110 may be turned off in response to the disabled first trigger signal TRG<0>, and accordingly, the output nodes ND1 and ND2 may retain the state precharged to the level of the output voltage VDDQ.

When the first trigger signal TRG<0> is enabled, the first trigger unit 100 may operate in substantially the same manner as in the second period R2.

Since the operations of the second to fourth trigger units 200 to 400 in the first mode are the same as the operations of the first trigger unit 100, detailed descriptions thereof will be omitted herein.

Operations of the data output circuit 10 in the second mode are as follows.

The signal generation unit 500 may retain only the first trigger signal TRG<0> in the enabled state (e.g., 701 in FIG. 7) and retain the second to fourth trigger signals TRG<1:3> in the disabled state (e.g., 702 in FIG. 7) in response to the mode signal MODEB which is applied at the logic low level in the second mode.

The first trigger unit 100 may output the first data IN<0> and INB<0> as the first output data LAT<0> and LATB<0> in response to the enabled first trigger signal TRG<0> (e.g., 801 in FIG. 8). The eleventh transistor T11 of the mode detecting section 130 may be turned on in response to the mode signal MODEB which is applied at the logic low level, and accordingly, the control signal CTR may be enabled (e.g., 802 in FIG. 8). The data output section 110 may output the first data IN<0> and INB<0> as the first output data LAT<0> and LATB<0> in response to the first trigger signal TRG<0> and the control signal CTR which are enabled.

The second to fourth trigger units 200 to 400 may not output the second to fourth data IN<1:3> and INB<1:3> as the second to fourth output data LAT<1:3> and LATB<1:3> in response to the second to fourth trigger signals TRG<1:3> which are disabled.

Accordingly, in the second mode, the external device may normally perform a predetermined operation by monitoring the first output data LAT<0> and LATB<0> which are outputted through the first trigger unit 100.

The data output circuit in accordance with an embodiment of the present invention may shift the voltage levels of inputted data and output resultant data in a second mode.

In an embodiment of the present invention, an electronic system may include a data output circuit which outputs data signals by using trigger units therein. The data output circuit may operate not only when the system requests a data output operation, but also when the system request a particular operation other than the data output operation (e.g., a write leveling mode, a connectivity test mode, and a read preamble training mode). When the system requests a data output operation, the data output circuit may operate all the trigger units therein. When the system requests the particular operation, the data output circuit may operate only a predetermined trigger unit among the trigger units therein.

The electronic system may include a signal generation unit, a data output section, and a mode detecting section. The signal generation unit may generate a trigger signal. When the system requests a data output operation, the data output section may output data in response to the trigger signal and a control signal. When the system requests the particular operation, the signal generation unit may retain the trigger signal in an enabled state, the mode detecting section may retain the control signal in an enabled state in response to a mode signal indicating that the system requests the particular operation, and thus the data output section may output data, which may be used in a write leveling mode, a connectivity test mode, or a read preamble training mode.

While various embodiments have been described above, it will be understood to those skilled in the art that the embodiments described are by way of example only. Accordingly, the data output circuit described herein should not be limited based on the described embodiments.

What is claimed is:

1. A data output circuit comprising:
   a first trigger unit configured to be inputted with first data in a first mode and a second mode, and output the first data in response to a first trigger signal; and
   a signal generation unit configured to, in the first mode, output the first trigger signal in response to a first clock signal, and, in the second mode, retain the first trigger signal in a first state regardless of the first clock signal.

2. The data output circuit according to claim 1, wherein the first trigger unit shifts voltage levels of the first data.

3. The data output circuit according to claim 1, wherein the signal generation unit retains the first trigger signal in an enabled state in the second mode.

4. The data output circuit according to claim 1, wherein the first trigger unit comprises:
   a data output section configured to output the first data in response to the first trigger signal and a control signal; and a mode detecting section configured to retain the control signal in an enabled state in response to a mode signal indicating that the data output circuit is in the second mode.

5. The data output circuit according to claim 4, wherein the data output section includes output nodes which output the first data, and
wherein the output nodes are precharged in response to the control signal.

6. The data output circuit according to claim 5, wherein the first trigger unit further comprises:
a precharge control section configured to provide the control signal to perform a precharge operation of the output nodes according to whether the first data are outputted from the data output section in the first mode.

7. The data output circuit according to claim 6, wherein the precharge control section disables the control signal when the first data are outputted from the data output section.

8. The data output circuit according to claim 1, further comprising:
a second trigger unit configured to be inputted with second data in the first mode and the second mode, and output the second data in response to a second trigger signal,
wherein the signal generation unit, in the first mode, outputs the second trigger signal in response to a second clock signal, and, in the second mode, retains the second trigger signal in a second state regardless of the second clock signal.

9. The data output circuit according to claim 8, wherein the second trigger unit shifts voltage levels of the second data.

10. A data output circuit comprising:
a data output section configured to output inputted data in response to a trigger signal and a control signal in a first mode and a second mode; and
a mode detecting section configured to detect a mode signal indicating that the data output circuit is in the second mode and retain the control signal in a first state.

11. The data output circuit according to claim 10, wherein the data output section shifts voltage levels of the data.

12. The data output circuit according to claim 10, wherein the mode detecting section retains the control signal in an enabled state in the second mode.

13. The data output circuit according to claim 10, wherein the data output section includes output nodes which output the data, and
wherein the output nodes are precharged in response to the control signal.

14. The data output circuit according to claim 13, further comprising:
a precharge control section configured to provide the control signal to perform a precharge operation of the output nodes according to whether the data are outputted from the data output section in the first mode.

15. The data output circuit according to claim 14, wherein the precharge control section disables the control signal when the data are outputted from the data output section.

16. The data output circuit according to claim 14, wherein the precharge control section enables the control signal when the trigger signal is disabled.

17. A data output circuit comprising:
a first trigger unit configured to output first data in response to a first trigger signal which is enabled;
a second trigger unit configured to output second data in response to a second trigger signal which is enabled; and
a signal generation unit configured to, in a first mode, output the first and second trigger signals, which have pulse shapes, and, in the second mode, retain the first trigger signal in an enabled state and retain the second trigger signal in a disabled state.

18. The data output circuit according to claim 17, wherein the first trigger unit comprises:
a data output section configured to output the first data in response to the first trigger signal and a control signal; and
a mode detecting section configured to detect a mode signal indicating that the data output circuit is in the second mode and retain the control signal in an enabled state.

19. The data output circuit according to claim 18, wherein the data output section includes output nodes which output the first data, and
wherein the output nodes are precharged in response to the control signal.

20. The data output circuit according to claim 19, wherein the first trigger unit further comprises:
a precharge control section configured to provide the control signal to perform a precharge operation of the output nodes according to whether the first data are outputted from the data output section in the first mode.

* * * * *